United States Patent
Libsch et al.

(10) Patent No.: US 11,056,722 B2
(45) Date of Patent: Jul. 6, 2021

(54) TOOL AND METHOD OF FABRICATING A SELF-ALIGNED SOLID STATE THIN FILM BATTERY

(71) Applicant: INTERNATIONAL BUSINESS MACHINES CORPORATION, Armonk, NY (US)

(72) Inventors: Frank Robert Libsch, White Plains, NY (US); Ghavam G. Shahidi, Pound Ridge, NY (US); Ko-Tao Lee, Yorktown Heights, NY (US); Stephen M. Rossnagel, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 588 days.

(21) Appl. No.: 15/892,399

(22) Filed: Feb. 8, 2018

(65) Prior Publication Data

US 2019/0245246 A1 Aug. 8, 2019

(51) Int. Cl.
*C23C 14/54* (2006.01)
*C23C 14/35* (2006.01)
(Continued)

(52) U.S. Cl.
CPC ......... *H01M 10/0585* (2013.01); *C23C 14/06* (2013.01); *C23C 14/0641* (2013.01);
(Continued)

(58) Field of Classification Search
None
See application file for complete search history.

(56) References Cited

U.S. PATENT DOCUMENTS 4,654,119 A 3/1987 Cook
5,683,561 A * 11/1997 Hollars ............ H01L 21/67259
204/298.25
(Continued)

FOREIGN PATENT DOCUMENTS

JP 63139844 A * 6/1988
JP 04031395 A * 2/1992
JP 10226595 A * 8/1998

OTHER PUBLICATIONS

List of IBM Patents or Applications Treated as Related.
(Continued)

*Primary Examiner* — John J Brayton
(74) *Attorney, Agent, or Firm* — Intelletek Law Group, PLLC; Gabriel Daniel, Esq.

(57) ABSTRACT

A solid state electrochemical battery fabrication device and a method of creating the solid state electrochemical battery are provided. There is a first chamber comprising a first magnetron and a second chamber comprising a second magnetron, coupled to the first chamber. There is a third chamber comprising a vapor source for a polymer deposition, coupled to the second chamber. A Knudsen cell is coupled to the third chamber and configured to deposit lithium on a battery being fabricated. A linear hollow shaft connects the first, second, and third chambers, and provides a hermetic seal. A first telescopic arm having a housing is coupled to a first end of the hollow shaft and configured to extend out of its housing from the first chamber to the second chamber.

15 Claims, 8 Drawing Sheets

(51) Int. Cl.
  *C23C 14/06* (2006.01)
  *C23C 14/08* (2006.01)
  *H01M 10/0585* (2010.01)

(52) U.S. Cl.
  CPC ............ *C23C 14/08* (2013.01); *C23C 14/542* (2013.01); *C23C 14/545* (2013.01); *C23C 14/35* (2013.01); *H01M 2300/0068* (2013.01)

(56) References Cited

U.S. PATENT DOCUMENTS

| | | | |
|---|---|---|---|
| 6,235,621 B1 | 5/2001 | Jeng | |
| 6,263,679 B1 * | 7/2001 | Paynting | ................ F04B 37/08 277/630 |
| 6,383,945 B1 | 5/2002 | Huang et al. | |
| 7,094,500 B2 | 8/2006 | Ugaji et al. | |
| 7,348,096 B2 | 3/2008 | Schubert et al. | |
| 7,959,769 B2 | 6/2011 | Zhang et al. | |
| 9,018,098 B2 * | 4/2015 | Winniczek | ........ H01J 37/32082 438/692 |
| 9,614,256 B2 | 4/2017 | Karlovsky et al. | |
| 9,761,847 B2 | 9/2017 | Chen et al. | |
| 9,941,507 B2 | 4/2018 | Pirk et al. | |
| 2004/0058237 A1 | 3/2004 | Higuchi et al. | |
| 2010/0133092 A1 * | 6/2010 | Mashimo | .............. C23C 14/225 204/192.21 |
| 2012/0021298 A1 | 1/2012 | Maeda | |
| 2013/0149592 A1 | 6/2013 | Hayashi et al. | |
| 2014/0272560 A1 | 9/2014 | Huang et al. | |
| 2015/0084157 A1 | 3/2015 | Tegen et al. | |
| 2015/0086809 A1 | 3/2015 | Lemke et al. | |
| 2015/0165769 A1 | 6/2015 | Nystrom et al. | |
| 2015/0188195 A1 | 7/2015 | Matsushita | |
| 2015/0340727 A1 | 11/2015 | Iwamoto | |
| 2015/0349370 A1 | 12/2015 | Snyder et al. | |
| 2017/0073805 A1 * | 3/2017 | Gittleman | ............. G02F 1/1508 |
| 2017/0114444 A1 * | 4/2017 | Lemberger | ............. H01L 33/46 |
| 2017/0155256 A1 | 6/2017 | Fujimaki et al. | |
| 2018/0006333 A1 | 1/2018 | Brew | |
| 2018/0315965 A1 | 11/2018 | Fallourd | |
| 2019/0244815 A1 | 8/2019 | Libsch | |
| 2019/0312298 A1 | 10/2019 | Ni | |
| 2019/0319252 A1 | 10/2019 | Hasegawa et al. | |

OTHER PUBLICATIONS

R. Hahn et al., "Integrated lithium micro batteries for highly miniaturized sensors," Proceedings of 7th GMM-Workshop, Energy Self-Sufficient Sensors, 2014, VDE, 6 pages.

F. Xu et al., "Properties of lithium phosphorus oxynitride (Lipon) for 3D solid-state lithium batteries," Journal of Materials Research, vol. 25, No. 8, 2010, pp. 1507-1515.

J. Kim et al., "Influence of the Microstructures on the Electrochemical Performances of LiCoO2 Thin Films by GLAD," 221st ECS Meeting, the Electrochemical Society. Meeting Abstract No. 242, 2012.

* cited by examiner

100

| PASSIVATION |
| 112 |
| POLAR CONDUCTOR 2 (ANODE) |
| 110 |
| LITHIUM |
| 109 |
| ELECTROLYTE 1 |
| 108 |
| POLAR CONDUCTOR 1 (CATHODE) |
| 106 |
| CONDUCTIVE ELECTRODE 1 |
| 104 |
| SUBSTRATE |
| 102 |

FIG. 1

TOOL AND METHOD OF FABRICATING A SELF-ALIGNED SOLID STATE THIN FILM BATTERY

BACKGROUND

Technical Field

The present disclosure generally relates to electrochemical cells, and more particularly, to solid state thin film batteries and the manufacture thereof.

Description of the Related Art

Today, electrochemical batteries are used in a variety of applications, including portable electronics (e.g., smart phones, tablets, emerging sub-millimeter sized intelligent Internet of Things (IOT), music players, etc.), power tools, remote sensors, power supplies for military and aerospace applications, power supplies for vehicles (e.g., hybrid electric vehicles, plug-in hybrid electric vehicles, and fully electric vehicles), etc. These batteries may be combined with other sources of power, such as internal combustion engines, capacitors, solar cells, fuel cells, etc. Common electrochemical cells typically use organic solvent electrolytes that may be in the form of a liquid or gel. An emerging type of electro-chemical cells that is gaining in popularity is the solid-state cell, which is a battery that has both solid electrodes and solid electrolytes. Such solid-state cells are still in the experimental state.

SUMMARY

According to one embodiment, a solid state electrochemical battery fabrication device is provided. There is a first chamber comprising a first magnetron and a second chamber comprising a second magnetron, coupled to the first chamber. There is a third chamber comprising a vapor source for a polymer deposition, coupled to the second chamber. A Knudsen cell is coupled to the third chamber and configured to deposit lithium on a battery being fabricated. A linear hollow shaft connects the first, second, and third chambers, and provides a hermetic seal. A first telescopic arm having a housing is coupled to a first end of the hollow shaft and configured to extend out of its housing from the first chamber to the second chamber.

In one embodiment, the first chamber further comprises a pump configured to evacuate at least the first chamber and the second chamber via the hollow shaft.

In one embodiment, there is a pump coupled to the Knudsen cell and configured to evacuate the third chamber in preparation of at least lithium (Li) particle deposition.

In one embodiment, the first magnetron is a direct current (DC) sputtering gun configured to provide $LiCoO_2$ particles during a first polar conductor deposition step.

According to one embodiment, a method of creating a solid state electrochemical battery using a fabrication device having a plurality of chambers is provided. A first conductive electrode layer is deposited on top of a substrate. A first polar conductor layer is deposited on top of a portion of the conductive electrode layer in a first chamber of the fabrication device. A first solid electrolyte layer is deposited after the first polar conductor layer, in a second chamber of the fabrication device. A lithium layer is deposited after the first solid electrolyte layer in a third chamber of the fabrication device. A second conductive electrode layer is deposited after the lithium layer. At least one passivation layer is deposited after the second conductive electrode layer in the third chamber of the fabrication device, wherein the plurality of chambers is atmosphere controlled.

In one embodiment, the deposition of lithium layer is via a Knudsen cell.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 1 illustrates a simplified cross-section view of a self-aligned solid state thin film battery having a storage cell, consistent with an exemplary embodiment.

DETAILED DESCRIPTION

Overview

Figure 2A:
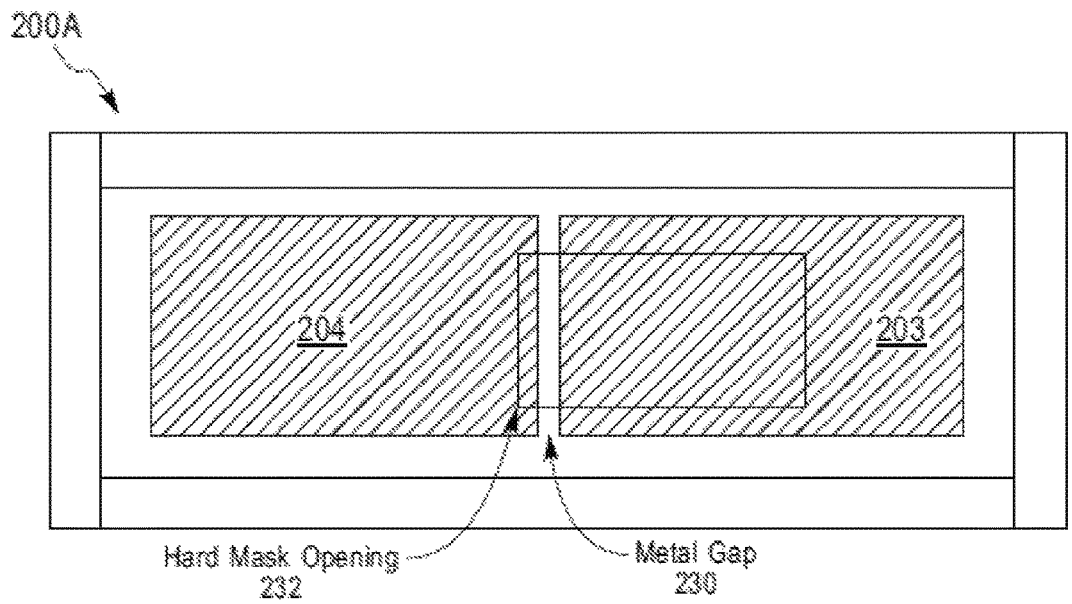
FIG. 2A illustrates a top view of a self-aligned solid state thin film battery during a first polar conductor deposition.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

The present disclosure relates to solid state thin film batteries and the manufacture thereof. Such solid-state batteries have several advantages over conventional batteries using liquid/gel electrolytes. While conventional batteries using liquid electrolytes, such as lithium batteries, can provide high energy densities and provide rechargeable properties, they come with safety concerns, including the potential for flammability.

In contrast, a solid-state battery is intrinsically more stable than batteries based on liquid electrolyte cells, since such battery does not include a liquid that may cause uncontrolled reactions, such as thermal runaway, or even explosion. Unlike traditional structures, where there is an inherent tradeoff between energy density and power density, the structures discussed herein can overcome such constraints. Thus, a better optimization of high energy capacity with high power density is provided.

In one aspect, various layers, sometimes referred to herein as films, are self-aligned, which provides for scalability and lower cost, and a solid-state 3D battery integration. As the device size of today's electronics continues to shrink, the scalability of the battery becomes increasingly salient. Further, there is larger throughput volume (i.e., lower cost) and an all in-situ battery film deposition process that eliminates reactivity of exposed battery films. The structures discussed herein may eliminate the resulting shortened charge/discharge cycles as well as diminish charge capacity with cycling. Still further, safety is improved by eliminating flammable liquid electrolytes that are used in conventional battery fabrication methods by virtue of the solid-state electrolyte and fabrication process discussed herein. The techniques described herein may be implemented in a number of ways. Example implementations are provided below with reference to the following figures.

Example Layers of a Solid-State 3D Battery

Reference now is made to FIG. 1, which illustrates a simplified cross-section view of a self-aligned solid state thin film battery (SSTFB) 100 having a storage cell, consistent with an exemplary embodiment. Battery 100 includes a substrate 102, a first conductive electrode layer 104, a first polar conductor layer 106, a first electrolyte layer 108, a lithium layer 109, a second polar conductor layer 110, and a passivation layer 112. In one embodiment, the first polar conductor 106 is a cathode and the second polar conductor 110 is an anode of the battery 100.

While a single cell structure is illustrated in FIG. 1 by way of example, it will be understood that additional cells may be coupled to the cell of FIG. 1. In various embodiments, a different number of cells may be stacked on top of each other (and/or adjacent to each other) thereby providing a 3-D battery structure. These multiple cells may be electrically coupled in series and/or in parallel to provide a battery 100 with increased voltage and/or current, respectively. For example, battery 100 may be viewed as a cell module in a plurality of storage cells that are stacked on top of one another.

As described more fully below, the devices disclosed herein may be formed in and above a bulk substrate 102, such as Si, SiO2, and/or silicon on insulator (SOI). Accordingly, in various embodiments, the substrate 102 may be over a SOI layer (not shown) to prevent leakage and to improve device performance. Other materials that may be used include sapphire, aluminum oxide, germanium, gallium arsenide (GaAs), indium phosphide (InP), an alloy of silicon and germanium, etc. The substrate 102 can act as a conductor or an insulator, depending on the materials and concentrations chosen. Thus, as used herein, the term substrate 102 includes all forms of semiconductor structures. The substrate serves as the foundation upon which the SSTFB can be built. Advantageously, other devices and structures, such as transistors, diodes, integrated circuits (IC's), etc., can be built alongside and/or on top of the battery 100 discussed herein.

In various embodiments, the conductive electrode layer 104 may be a metal such as Ni, Pt, Al, Cu, or any other appropriate metal or conductive semiconductor, or any combination thereof. There may be a plurality of conductive electrodes on the conductive electrode layer 104 that are separated by a metal gap, discussed in more detail later.

The cathode (first polar conductor) layer 106 may comprise metal oxides that are deposited as a film by various methods. An example method is discussed later. In various embodiments, the materials used in the cathode layers may be Lithium Cobalt Oxide (LiCoO) (or Lithium Cobaltate), Lithium Manganese Oxide, Lithium Iron Phosphate, Lithium Nickel Manganese Cobalt (NMC), hard carbon, Tin monoxide (SnO) glass, graphite, Si alloys, Cobalt Oxide (CoO or $Co_3O_4$) nano particles, and Lithium Nickel Cobalt Aluminum Oxide (NCA). In one embodiment, the cathode layer may be a film of any positive electrode material having an electric potential greater than 1V in reference to metallic Li. The thickness of the cathode layer 106 may be in the range of 100 nm to 10 μm, inclusive.

The electrolyte layer 108, during a discharge of the battery 100, allow ions to be transported from the cathode to the anode of the corresponding cell (referred to herein as polar conductors 1 and 2). Alternatively, during a charge operation, the electrolyte layer 108 allows ions to be transported from the anode to the cathode. Unlike conventional electrolytes that are liquid or gel, the electrolytes discussed herein are solid. For example, the electrolyte layer 108 may be a film of lithium phosphorous oxynitride (LiPON), which is an amorphous glassy material. Instead of having separate components of electrolyte, binder, and separator, the solid electrolyte discussed herein may act as all three. In one embodiment, the electrolyte layer 108 is made as thin as possible, but minimizing the formation of pin holes. For example, the electrolyte layer can be 1 μm or less. The solid electrolyte layer 108 further increases the overall energy density of the battery 100, because the components of the combination of cell(s) therein is/are more densely packed.

Further, various degradation effects are avoided by virtue of using solid electrolytes. For example, for conventional batteries using liquid/gel electrolytes, as the battery ages over time, its anode grows granular structures, protruding through the electrolyte, a phenomenon sometimes referred to as dendrites. Dendrites are whiskers of lithium that grow inside batteries, and can cause the devices that are powered thereby to lose power more quickly, short out, or in severe cases, even catch fire or explode. As energy demands per unit area increase, the formation of dendrites becomes a more serious issue. By virtue of using the structures discussed herein, which include the solid electrolyte, the dendrite problem is essentially eliminated.

The lithium layer 109, which provides additional lithium ions to be transported between the cathode and anode (or in reverse depending on the charge/discharge cycle).

The anode (second polar conductor) layer 110 may be of graphite or carbon nanotube. In one embodiment, the anode layer may be a film of any negative electrode material that has an electric potential of less than 1V in reference to a metallic Li layer 109. When the cell of the battery 100 charges and discharges, ions shuttle between cathode (positive electrode) and anode (negative electrode). On discharge, the anode undergoes oxidation, or loss of electrons, and the cathode sees a reduction, or a gain of electrons. Charge reverses the movement, as discussed previously.

To accommodate the high reactivity of some battery layers with the environment, such as the lithium layer 109, a passivation layer 112 is included. The passivation layer 112 may be based on a film of lithium chloride (LiCl) that is formed on the surface, or a separate layer, such as the family of polyimides. It serves to protect the battery 100 from discharging on its own and/or degrading with the environment when a load is removed from the battery 100.

Example Process for a Solid-State Battery

Figure 2B:
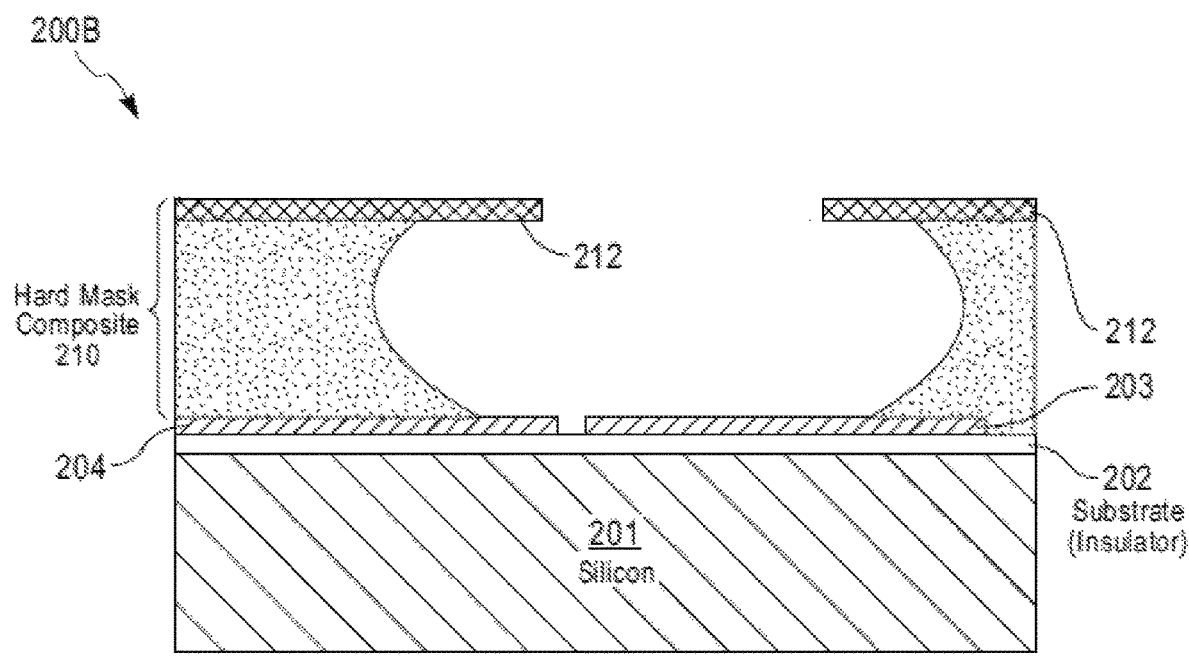
FIG. 2B illustrates a side front-section view of a self-aligned solid state thin film battery during a first polar conductor deposition.

With the foregoing description of the various layers of solid state thin film batteries, it may be helpful to discuss an example process of manufacturing the same. To that end, FIGS. 2A and 2B illustrate a top view and a side front-section view, respectively, of a self-aligned solid state thin film battery (SSTFB) during a first polar conductor (e.g., cathode) deposition. The side front-section view 200B illustrates a bulk material 201, which may be silicon (Si), on top of which the present structure is built.

The front-section view 200B illustrates a substrate layer 202, which may act as an insulator between the cells and the bulk 201, that is deposited over the bulk material 201. There is a first conductive electrode 203 and a second conductive electrode 204 that, in one embodiment, are coplanar. Stated differently, the first and second conductive electrodes 203 and 204 are deposited at the same lithographic step on top of the substrate 202. Although the first and second conductive electrodes 203 and 204 are coplanar, there is no electrical contact between them, since they are separated by at least the metal gap 230 and formed on an insulator.

A hard mask composite 210, which may be based on SixNy/SiO$_2$, SiO$_2$/PolySi, SiO$_2$/PolySi/SixNy or any other suitable material used in semiconductor processing as an etch mask, is deposited over the first conductive electrode layer (203 and 204). There is an opening 232 from which additional deposits can be achieved. Through this opening 232, the hard mask composite 210 is etched, creating a larger opening below the etch mask, sometimes referred to as a sacrificial hard mask 212, that can be defined initially by photoresist. Sometimes, it is advantageous to remove the photoresist material if these organic materials outgas in subsequent vacuum deposition tooling that prevents reaching appropriate deposition vacuum levels. In this manner, the photoresist will anisotopically define the top portion of the hard mask composite 210 that is formed from one material, such as oxide, silicon dioxide, nitride, or silicon nitride that has a different chemical etch selectivity compared to the lower part of the hard mask composite 210, which may be formed from a second material such as polysilicon or amorphous silicon.

In various embodiments, subsequent etching may be by way of a liquid ("wet") or plasma ("dry") chemical agent that isotropically removes the lower portion of the hard mask composite 210 in the areas that are not protected by the top portion of the hard mask composite 212. As illustrated in FIG. 2B an isotropic etch can produce round sidewalls. Alternatively, dry etching techniques can be used, as they can be made anisotropic, in situations where it is desired to avoid significant undercutting of the top portion of the hard mask composite pattern 212. Anisotropic etching becomes more salient when the width of the features to be defined is similar to or less than the thickness of the material being etched. In contrast, a wet etch processes can be used, which are isotropic in nature. As illustrated in FIG. 2B, a wet etch allows a more curved etching, thereby providing a larger opening below the top portion of the hard mask composite 212. In this way, a single top portion of the hard mask composite pattern 212 can be used for multiple layer depositions, as described in more detail below.

Figure 3:
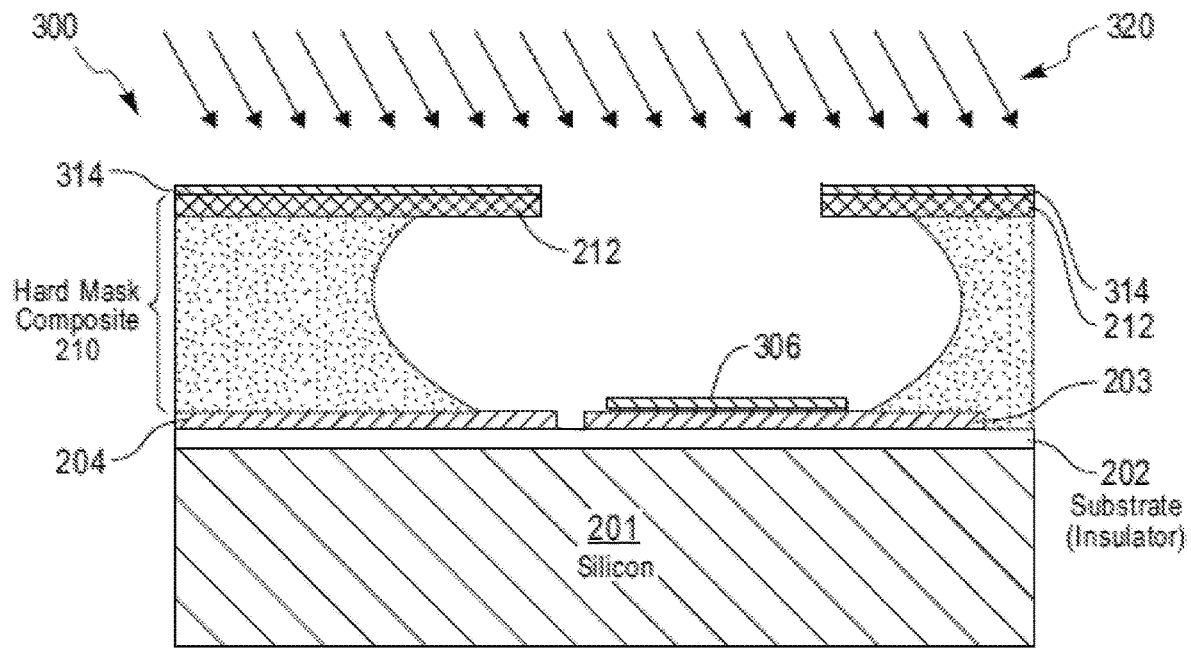
FIG. 3 illustrates a side front-section view of a self-aligned solid state thin film battery during a first polar conductor deposition step.

FIG. 3 illustrates a side front-section view of a self-aligned SSTFB during a first polar conductor deposition step. The first polar conductor layer (e.g., a cathode) 306 is deposited by way of an intense light 320, referred to herein as an angle deposition. It will be well understood that deposition by intense light is not restricted to DC or AC sputtering or evaporation as described later, but can be directionally deposited by other ways that are common in solid state device fabrication. In one embodiment, the intense light is at a predetermined angle (that is not perpendicular to the substrate), sometimes referred to herein as a first deposition angle. In this way, the first polar conductor layer 306 can be deposited on top of the first conductive electrode 203 that is beyond the hard mask opening 232. During the deposition of the first polar conductor layer 306, the first conductive electrode 203 is covered in part, but the second conductor 204 is not covered. In one embodiment, this step is performed in a first chamber of a plurality of chambers of a fabrication tool, discussed in more detail later.

Figure 4:
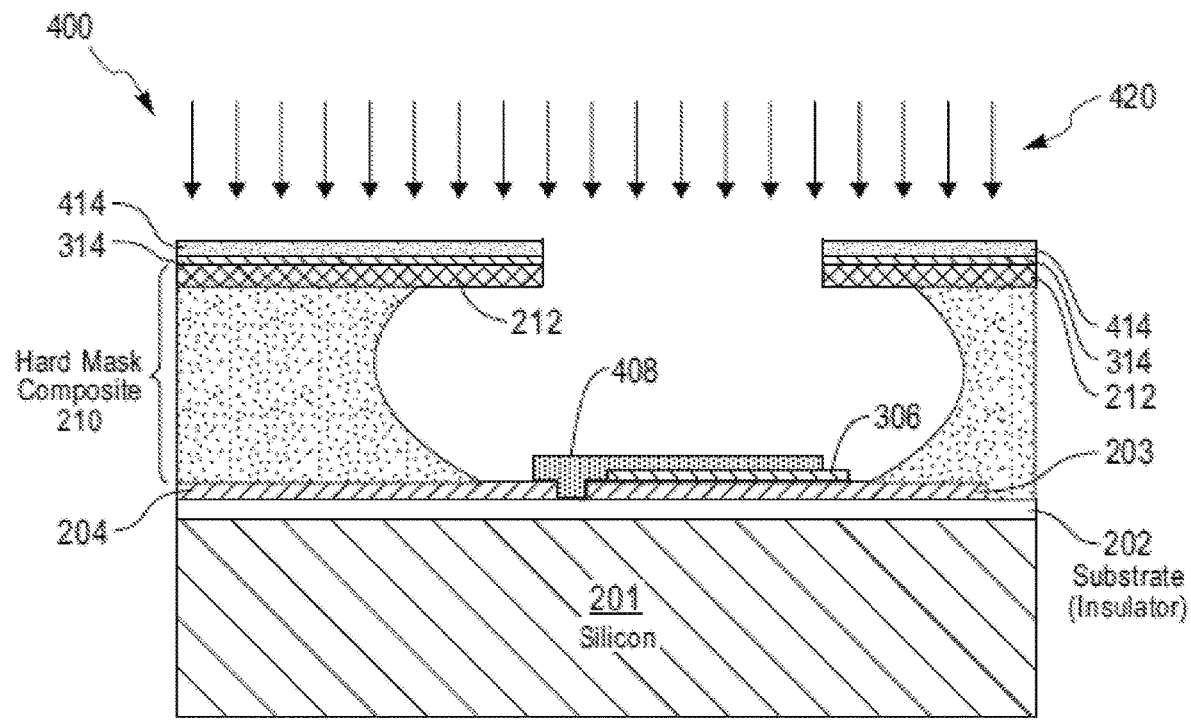
FIG. 4 illustrates a side front-section view of a self-aligned solid state thin film battery during a first electrolyte deposition step.

FIG. 4 illustrates a side front-section view of a self-aligned SSTFB during a first electrolyte deposition step. The same opening as in the prior step (i.e., deposition of the first polar conductor) is used, represented by opening 232 in the top view 200A of FIG. 2A and the photoresist/top portion of the hard mask composite 212 in the front-section view 400.

The first electrolyte layer 408 is deposited by way of an intense light 420 that, in one embodiment, is in a direction that is substantially perpendicular to the substrate 202. In this way, the first electrolyte 308 can be deposited on top of the first polar conductor 306 and part of the second conductive electrode 204. The first electrolyte layer is also deposited on the photoresist/top portion of the sacrificial hard mask composite 212 on top of layer 314, as layer 414. Significantly, by using the same photoresist/top portion of the sacrificial hard mask composite 212, the first electrolyte layer 408 that is created in this step is self-aligned with the structures below. In one embodiment, this step is performed in a second chamber of a plurality of chambers of a fabrication tool, discussed in more detail later.

Figure 5:
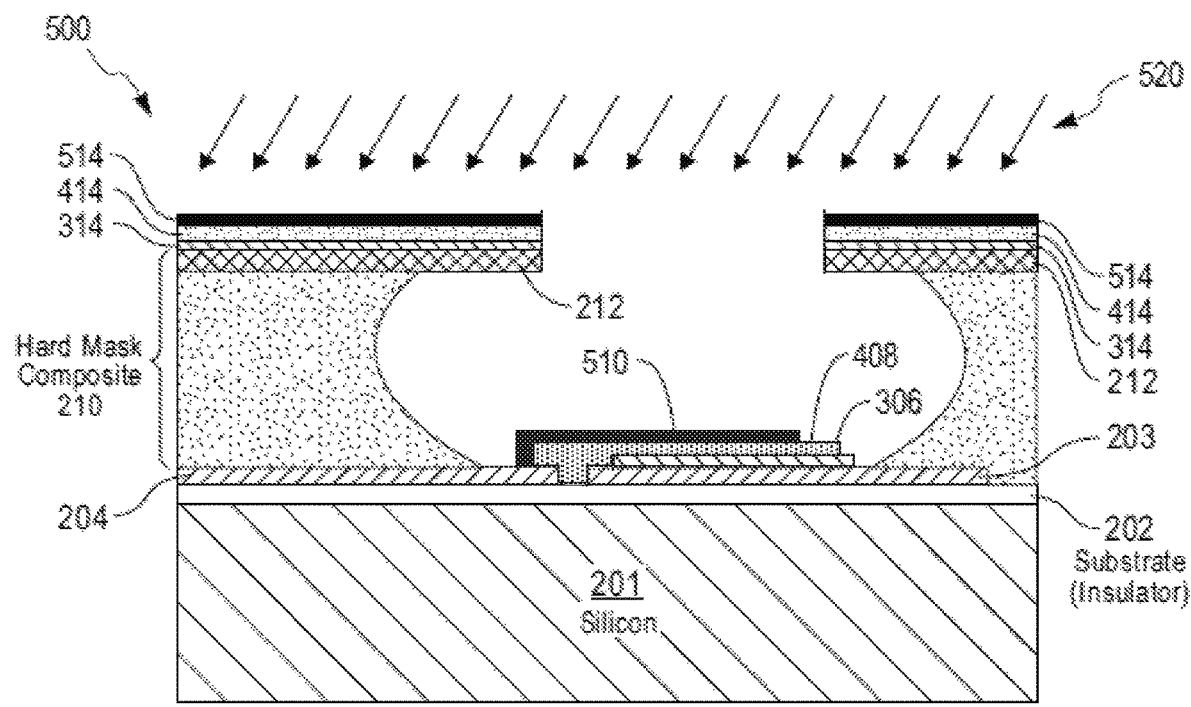
FIG. 5 illustrates a side front-section view of a self-aligned solid state thin film battery during a lithium (Li) deposition step.

FIG. 5 illustrates a side front-section view of a self-aligned SSTFB during a lithium (Li) deposition step. Again, the same opening 232 is used (as in prior steps discussed in the context of FIGS. 2 to 4) to introduce the lithium layer 510, which is deposited by way of an intense light 520. In one embodiment, the direction of the intense light 520 is in a direction that is not perpendicular to the substrate 202, but more towards the second conductive electrode 204, sometime referred to herein as a second deposition angle. The lithium layer 510 is also deposited on the photoresist/top portion of the sacrificial hard mask composite 212 on top of layer 414, as layer 514. The same photoresist/top portion of the sacrificial hard mask composite 212 mask is used to provide for better self-alignment with the structures below. In one embodiment, this step is performed in a third chamber of a plurality of chambers of a fabrication tool, discussed in more detail later.

Figure 6:
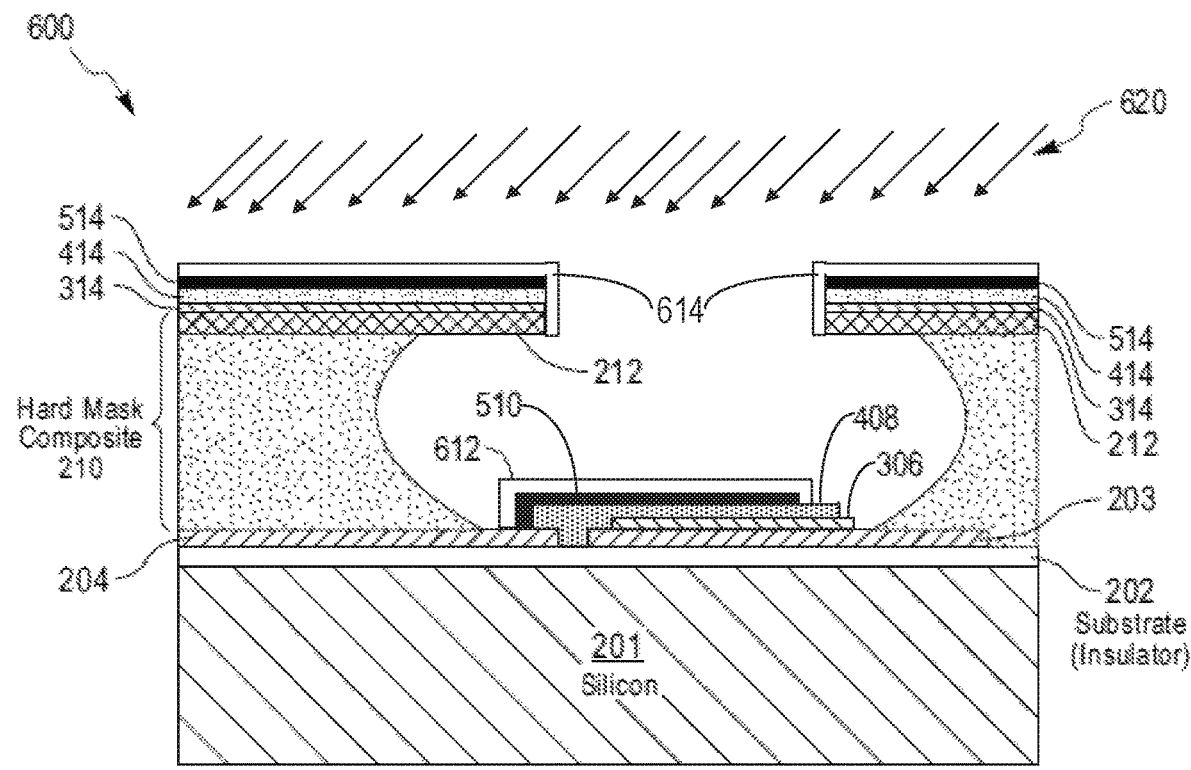
FIG. 6 illustrates a side front-section view of a self-aligned solid state thin film battery during a second polar conductor layer deposition step that encapsulates a lithium layer.

FIG. 6 illustrates a side front-section view of a self-aligned SSTFB during a second polar conductor layer (e.g., anode) deposition step that encapsulates the lithium layer 510. Again, the same opening 232 is used (as in prior steps discussed in the context of FIGS. 2 to 5) to introduce the second polar conductor layer 612, which is deposited by way of an intense light 620. In one embodiment, the direction of the intense light 620 is in a direction that is not perpendicular to the substrate 202, but more towards the second conductive electrode 204, sometime referred to herein as a third deposition angle. The third deposition angle may be at an angle between perpendicular to the substrate 202 and the second deposition angle discussed in the context of FIG. 5. Stated differently, the third deposition angle may be more perpendicular than the second deposition angle. It is understood that the intent of layer 620 is to ideally cover with layer 612 the prior layer of 510 but not to contact layer 306 or layer 203.

The second polar conductor layer 620 is also deposited on the photoresist/top portion of the sacrificial hard mask composite 212 on top of layer 514, as layer 614. In this way, the second polar conductor layer (e.g., anode) can be deposited on top of the Li layer 510 and electrically connected to the second conductive electrode 204. Again, the same photoresist/top portion of the sacrificial hard mask composite 212 mask is used to provide for better self-alignment with the structures below. In one embodiment, this step is performed in a first chamber of a plurality of chambers of a fabrication tool, discussed in more detail later.

Figure 7:
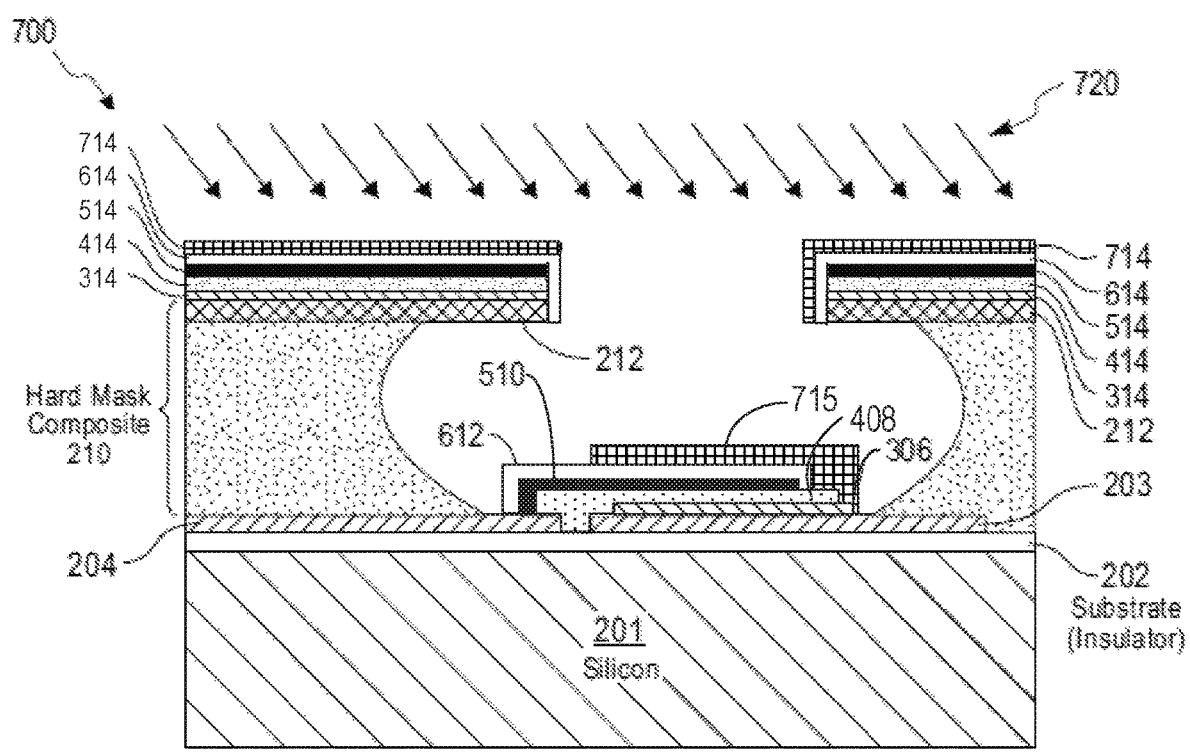
FIG. 7 illustrates a side front-section view of a self-aligned solid state thin film battery during a first passivation layer deposition step.

FIG. 7 illustrates a side front-section view of a self-aligned SSTFB during a first passivation layer deposition step. Opening 232 is used to introduce the first passivation layer 715, which is deposited by way of an intense light 720. In one embodiment, intense light 720 is an angle deposition that is in a direction that is not perpendicular to the substrate 202, but more towards the first conductive electrode 203. In one embodiment, the angle of the angle deposition 720 is at the first deposition angle. By virtue of using this angle, any exposed portion of the first polar conductor layer 306 and the first electrolyte layer 408 is covered.

The first passivation layer 715 is also deposited on the photoresist/top portion of the sacrificial hard mask composite 212 on top of layer 614, as layer 714. The same photoresist/top portion of the sacrificial hard mask composite 212 mask is used to provide for better self-alignment with the structures below.

Figure 8:
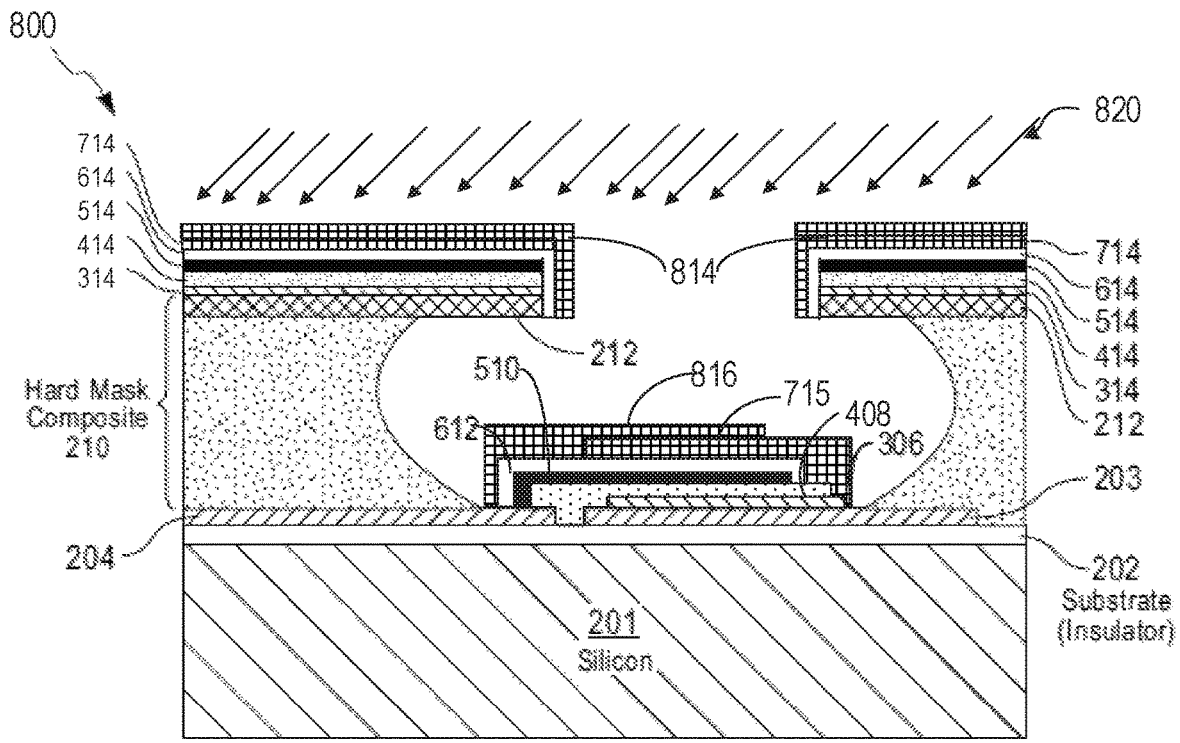
FIG. 8 illustrates a side front-section view of a self-aligned solid state thin film battery during a second passivation layer deposition step.

FIG. 8 illustrates a side front-section view of a self-aligned SSTFB during a second passivation layer deposition step, which is introduced via the same opening 232. The second passivation layer 816 is deposited by way of an intense light 820. In one embodiment, the intense light 720 is an angle deposition that is in a direction that is not perpendicular to the substrate 202, but more towards the second conductive electrode 204. The angle of the angle deposition 820 may be at the second deposition angle. By virtue of using the second deposition angle, any remaining exposed portion of the cell is covered.

The second passivation layer 814 is also deposited on the photoresist/top portion of the sacrificial hard mask composite 212 on top of layer 714, as layer 814. In one embodiment, the first and second passivation layers are deposited in the third chamber of a plurality of chambers of a fabrication tool, discussed in more detail later.

Figure 9:
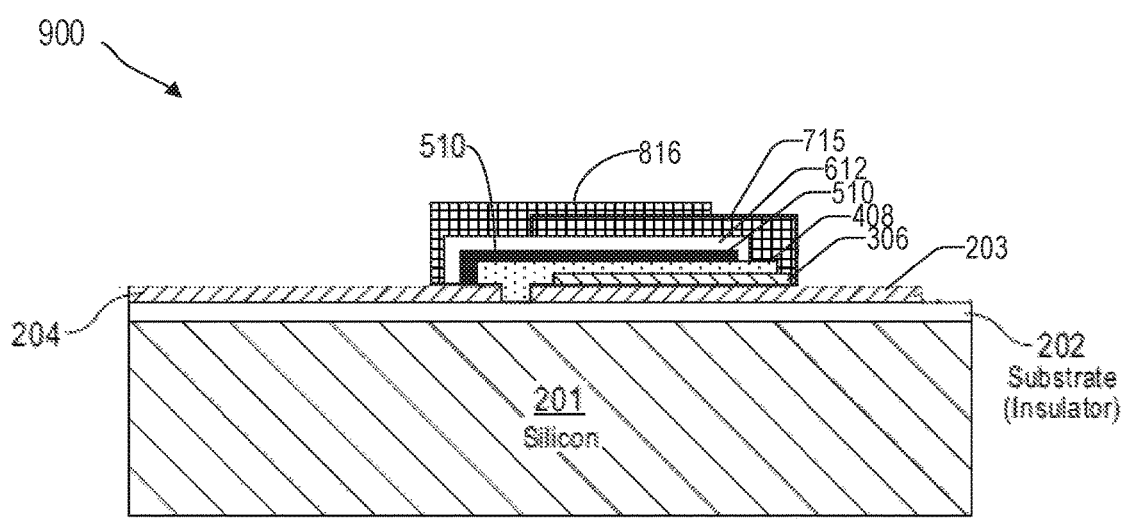
FIG. 9 illustrates a cross-section view of a completed self-aligned solid state thin film battery cell.

FIG. 9 illustrates a resulting cross-section view of a completed self-aligned SSTFB cell when the hard mask composite 210 is etched away, thereby removing all the layers of 212, 314, 414, 514, 614, 714, and 814 that are on top of the hard mask composite 210. Battery 900 may function as a primary battery, a secondary battery, or a super capacitor. Battery 900 represents an example structure that can be implemented by the process discussed herein. Battery 900 includes an electrically insulating base 201, such as silicon with an insulator cap, on top of which the remaining structure is built. There is a substrate 202, a first conductive electrode layer having a first conductive electrode 203 and a second conductive electrode 204 on top of the substrate 202. The first and second conductive electrodes 203 and 204 are coplanar, but electrically separate (i.e., disconnected). The first polar conductor layer 306 (i.e., cathode) is on top of the first conductive electrode layer.

There is a first solid electrolyte layer 408 on top of the first polar conductor layer 306. There is a lithium layer 510 on top of the first solid electrolyte layer 408. The second polar conductor (e.g., an anode) 612 is on top of the lithium layer 510.

To accommodate the high reactivity of some battery layers with the environment, such as lithium, a passivation layer is included, represented by layers 715 and 816 in FIG. 9. The passivation layer(s) may be based on a film of lithium chloride (LiCl) that is formed on the surface, or a separate layer, such as the family of polyimides. It serves to protect the battery 900 from discharging on its own and/or degrading the depth and/or the number of charge-discharge cycles in reaction to the environment.

While FIGS. 2 to 9 illustrate an example single battery cell, it will be understood that additional cells can be included, in view of the teachings herein. In various embodiments, the additional cells may be coupled in series and/or in parallel via additional deposition layers through the opening 232 before the final passivation layers 715/816.

By virtue of using the same photoresist pattern 212, the battery cells that are created are self-aligned and the process is simplified compared to other processes that use additional mask layers for the deposition of films. Thus, unlike conventional batteries, at least some of the layers discussed herein are self-aligned, which facilitates scalability and further miniaturization. Stated differently, since various layers discussed herein are self-aligned by virtue of using a single masking photoresist pattern 212 for all film depositions, regions that are typically wasted are avoided, thereby yielding a more compact battery size for a given energy density. More accurate alignment of films layers and smaller dimension batteries are now possible since they depend only on the deposition angle and not on any mask-to-mask alignment resolution of previous methods. In addition, any battery shape is enabled that can be defined with the single photoresist pattern 212.

Example SSTFB Manufacturing Tool

Figure 10:
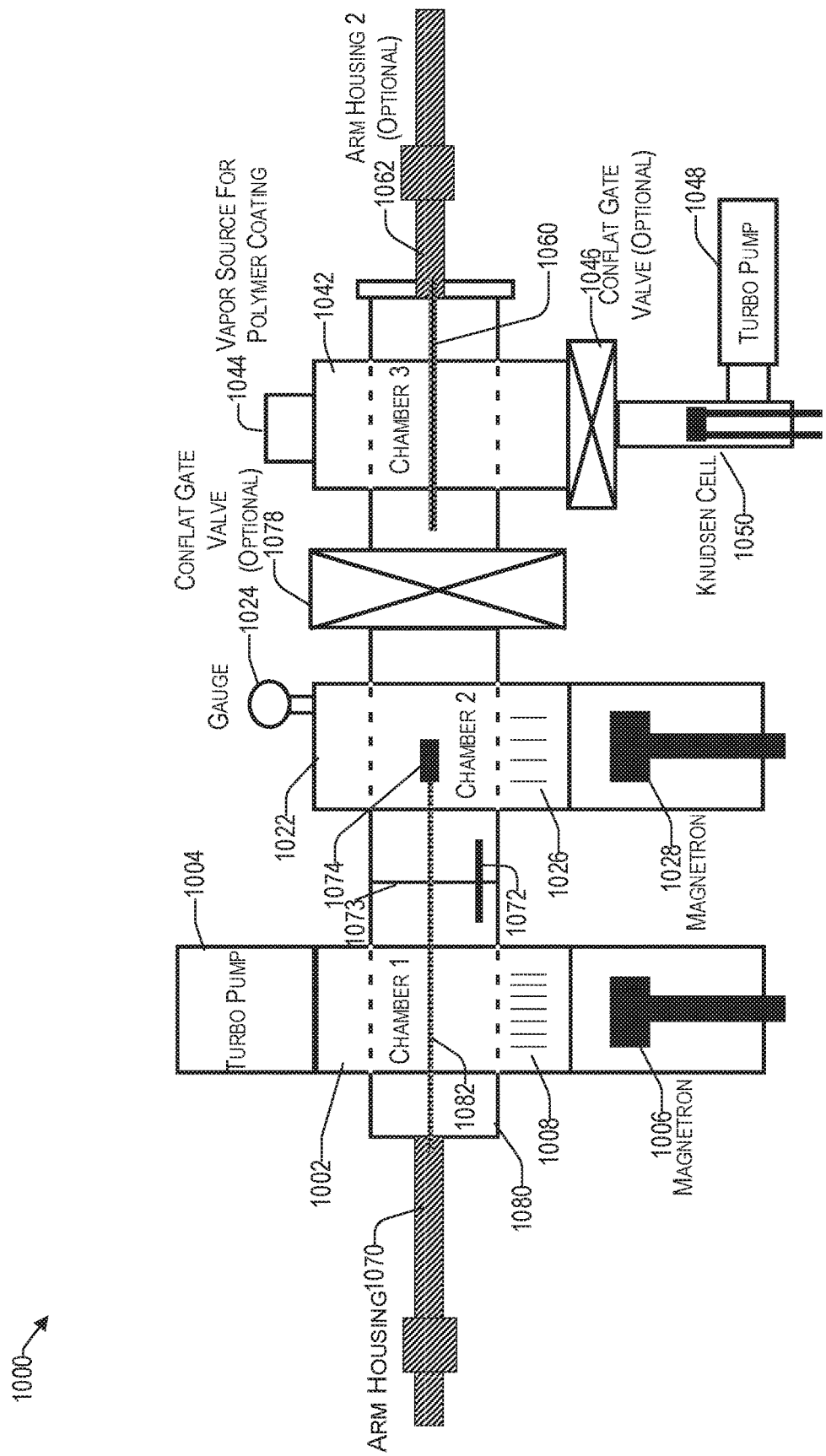
FIG. 10 is an example block diagram of a self-aligned solid state thin film battery tool, consistent with an illustrative embodiment.

FIG. 10 is an example block diagram of a self-aligned SSTFB fabrication tool 1000, consistent with an illustrative embodiment. The fabrication tool 1000 includes at least 3 separate chambers, namely the first chamber 1002, the second chamber 1022, and the third chamber 1042. Each chamber is configured to perform a separate one or more functions, discussed in detail below. The three chambers 1002, 1022, and 1042 are coupled together via a linear hollow shaft 1080 that allows a battery device being fabricated, referred to herein as the "subject device," to be carried from one chamber to another. To that end, there is a first telescopic arm 1082 that slidably extends out of its housing 1070 such that it can linearly transport a subject device from one chamber to another through the shaft 1080. For example, the arm has a sample holder 1074 onto which the device being manufactured (e.g., battery on a wafer) is carried. In one embodiment, the arm 1082 is rotatable by way of circular motion via its housing 1070, thereby allowing the device to be positioned in various angles in a first dimension. The first telescopic arm 1082 may linearly extend from the first arm housing 1070 all the way into the third chamber 3.

In one embodiment, the first telescopic arm 1082 need not extend linearly all the way to the third chamber 1042; rather, the first telescopic arm 1082 may be aided by a linearly telescoping arm 1060 from the second housing 1062, such that it can accept the subject device from the sample holder 1074 and carry the subject device into the third chamber 1042 for further processing. In this way, any contaminants that may be related to one chamber (e.g., first or second) are not introduced into the third chamber 1042 (as well as in the opposite direction).

The plurality of chambers (e.g., chambers 1 to 3 in the example of FIG. 10) and the shaft 1080 create a controlled environment that does not allow ambient contaminants to enter. Stated differently, the combination of the shaft 1080 and the three chambers 1080, 1022, and 1042 create a hermetically sealed environment that prevents ambient particles to contaminate and/or react with the device being fabricated. Accordingly, unlike known fabrication tools where the subject device is carried from one chamber to another without a vacuum, the fabrication tool herein controls the environment (e.g., temperature, pressure, humidity, and type of particles) that the battery device being manufactured is exposed to at every fabrication step, thereby efficiently providing a more contaminant free and reproducible SSTFB.

The first chamber 1002 includes a pump 1004 and a magnetron 1006. The pump 1004 is configured to evacuate the chambers 1002, 1022, and 1042 to create a vacuum therein. In some scenarios, there is an optional conflat gate valve 1078 between the second chamber 1022 and the third chamber 1042, which is opened to create a common vacuum between the chambers. The optional conflat gate valve 1078 is discussed in more detail later.

In one embodiment, the pump 1004 is located opposite to the magnetron 1006. The magnetron 1006 may be a direct current (DC) sputtering gun that is configured to provide $LiCoO_2$ particles during a first polar conductor deposition step (e.g., cathode) as discussed before in the context of FIG. 3.

Typically, during sputtering, the particles are ejected from a source into various directions. In one embodiment, the first chamber 1002 uses a collimator 1008 to provide passage to particles that are in the direction dictated by the collimator 1008. Thus, the collimator 1008 narrows the beam of particles generated by the magnetron 1006 to a desired direction, thereby giving the collimator a one-dimensional control of the deposition angle. Accordingly, the rotatable arm 1082 together with the collimator 1008 provide two-dimensional control of the deposition angle regarding the subject battery device being fabricated. In one embodiment, the angle of deposition in this step (sometimes referred to herein as the first deposition angle) may be 30 degrees with respect to perpendicular to the substrate (considered herein to be 0 degrees). The desired crystallization of the cathode may be accomplished at 700 C and >½ hour.

The second chamber 1022 includes a second magnetron 1028 and a gauge 1024. The second magnetron 1028 may be a radio frequency (RF) sputtering gun that is configured to provide $Li_3PO_4$ particles during an electrolyte deposition step as discussed before in the context of FIG. 4. By alternating the electrical potential with RF sputtering of the magnetron 1028, the surface of the target material can be "cleaned" of a charge buildup with each sputtering cycle. On the positive cycle electrons are attracted to the target material or cathode giving it a negative bias. On the negative portion of the cycle, ion bombardment of the target to be sputtered continues.

In one embodiment, the second chamber 1022 uses a second collimator 1026 to provide passage to particles that are in the direction dictated thereby, in a way that is similar in principle to the first collimator 1008. Thus, the rotatable arm 1082, together with the second collimator 1026, provide two-dimensional control of the deposition angle of the $Li_3PO_4$ particles, which may be substantially perpendicular (i.e., 0 degrees).

The gauge 1024 is configured to track the lithium phosphorous oxynitride (LiPON) deposition thickness during the step depicted in FIG. 4. In different embodiments, different types of gauges, such as a vacuum tube or a Rutherford backscattering spectrograph can be used. For example, the more LiPON coating there is, the more the vacuum tube is coated, thereby diminishing the light emitted therefrom. The intensity of light can be used as an indicator of the LiPON thickness.

The third chamber 1042 includes a vapor source for polymer coating and may include or be coupled to a Knudsen cell 1050. The third chamber 1042 can be used, for example, during the deposition of the Li and the second polar conductor (e.g., anode), as described above in the context of FIGS. 5 and 6, respectively. For example, Li is evaporated from a Knudsen cell 1050 while an arm (e.g., first arm 1082 or the second arm 1060 holds the device being manufactured at a predetermined angle, referred to herein as the second deposition angle. In one embodiment, the second deposition angle is 30 degrees with respect to perpendicular to the substrate. The Knudsen cell 1050 cell may be coupled to a second turbo pump 1048 configured to evacuate the any molecules (e.g., Li) in the third chamber 1042 to prevent contamination upon completion of the Li deposition step.

In one embodiment, there is a conflat gate valve 1046 coupled between the third chamber 942 and the Knudsen cell 1050. For example, the valve 1046 can be opened during the Li deposition step and closed when Li is not being deposited on the subject battery device being fabricated. In this way, the highly reactive Li is isolated in that it is released (i.e., conflat gate valve opened 1046) only during the Li deposition step discussed previously in the context of FIG. 5.

Figure 11:
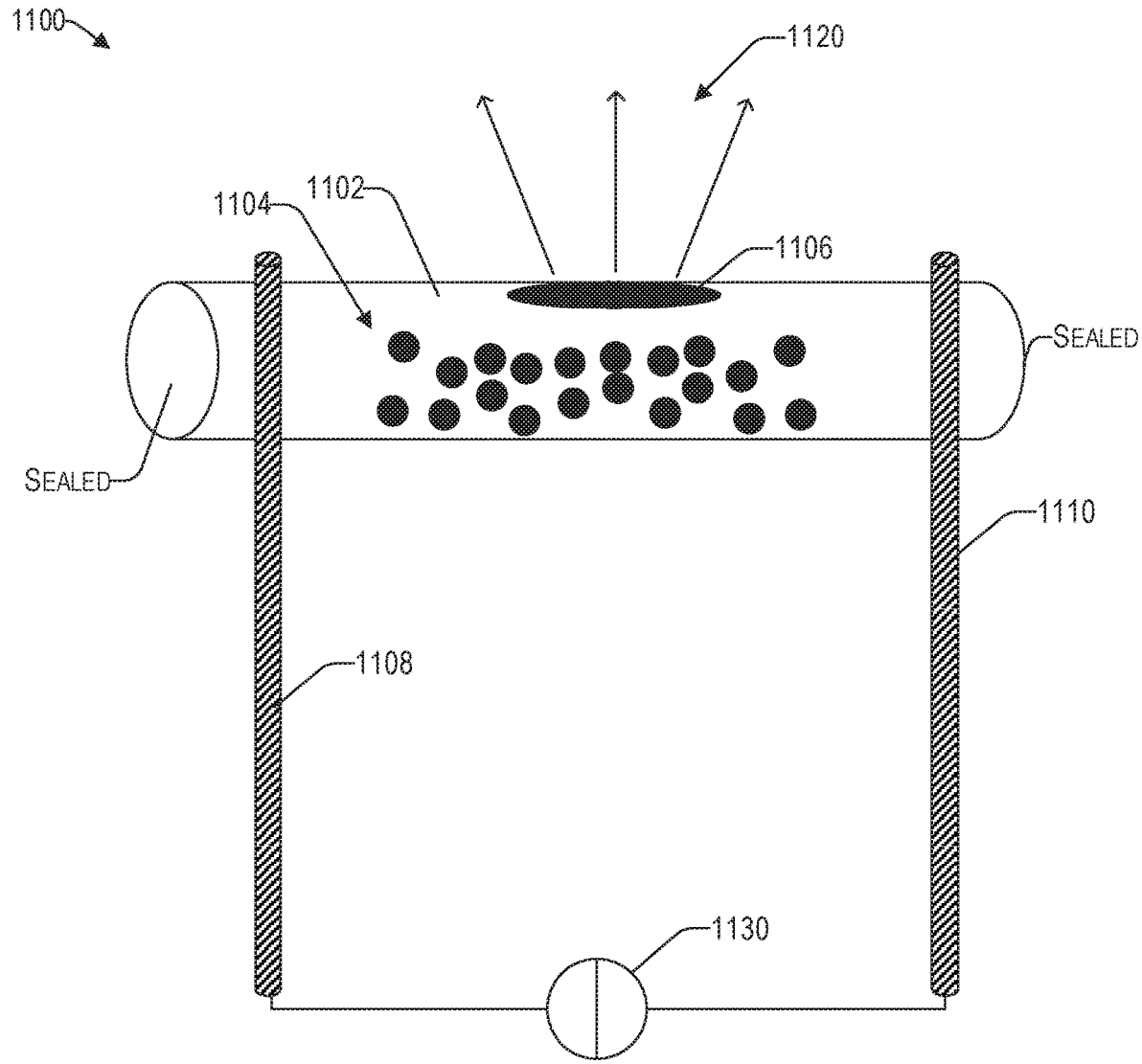
FIG. 11 is an example Knudsen cell that may be used to implement the Knudsen cell 1050 of FIG. 10, consistent with an illustrative embodiment.

FIG. 11 is an example Knudsen cell 1100 that may be used to implement the Knudsen cell 1050 of FIG. 10, consistent with an illustrative embodiment. The Knudsen cell 1100 is an effusion evaporator source that is configured to release Li particles 1104 from a tube 1102 when a predetermined temperature is reached. The Knudsen cell 1100 may have a feedthrough (i.e., 1108 and 1110) at each end of the tube 1102. In one embodiment, the feedthroughs 1108 and 1110 are 0.25" diameter Cu rods that are clamped tightly to each end of the tube 1102 that is sealed at both ends. The Cu rods are of sufficient thickness and of a predetermined conductance to enable minimum resistive induce voltage drop across the Cu rods and have good current carrying capability to allow most of the resistive heating (from resistive induced voltage drop) to appear across the Knudsen Ta tube described below. Cu has a conductance of $\sim 5.9 \times 10^7$/Ohm/m, which is an approximately an order of magnitude greater than $\sim 7.7 \times 10^6$/Ohm/m, the conductance of Ta. The tube 1102 is heated by passing DC 1130 current between the Cu feedthroughs 1108 and 1110, thereby increasing the temperature of the Li particles 1104 therein, ultimately reaching evaporation.

Thus, the Knudsen cell 1100 evaporates the Li particles into a gaseous phase inside the tube 1102. In one embodiment, the tube 1102 comprises one or more layers of tantalum (Ta) foil having a diameter of 0.25" and 1" in length. The Ta tube 1102 may comprise several layers of Ta foil having a thickness of 0.005". The tube 1102 may have an opening 1106 that is covered with a single Ta foil (e.g., of 0.005" thickness), which melts upon heating the tube 1102 to a predetermined temperature, thereby allowing the gaseous Li particles 1104 to escape 1120. In one embodiment, the single Ta foil thickness is several orders of magnitude thinner than the Knudsen cell tube to ensure the melting of the single Ta foil to create the Li evaporation opening. The high melting point and oxidation resistance of Ta makes it an effective metal for use in a vacuum chamber. Furthermore, Ta is extremely inert and suitable to hold the very reactive Li particles.

Returning to FIG. 10, following the Li and anode metal deposition, the third chamber 1042 can also be used for a gas-phase polymer deposition, sometimes referred to herein as a passivation layer, to be applied to encapsulate the Li from air exposure. One or more passivation layers, which may be based on a film of lithium chloride (LiCl), may be applied by the vapor source 1044 at a first deposition angle and a second deposition angle, as described previously in the context of FIGS. 6 and 7, respectively, by rotating the first or second arm (1082, 1060) such that the sample holder 1074 is at the appropriate angle of deposition. The passivation layer(s) protect the subject device from later discharging on its own and/or degrading with the environment when a load is removed from the battery.

In one embodiment, there is a heat element 1072, which may be a lamp, in the hollow shaft 1080, which may be positioned between the first chamber 902 and the second chamber 922. The vertical line 1073 represents an external flange mating boundary between the first chamber 1002 and the second chamber 1022. In one embodiment, the heat lamp 1072 is not intersected by this boundary 1073. The heat lamp 1072 is operative to control the temperature in the chambers of the fabrication tool 1000. In this regard, it is noted that as temperature is increased, the molecules in the chambers can move more easily, thereby allowing the molecules that are deposited on the subject battery device being manufactured to be crystallized and to provide a desired film orientation alignment (e.g., a microstructure orientation of 101). Stated differently, the heat lamp can anneal the deposited materials, providing a predetermined stoichiometry/microstructure orientation (e.g., 101).

In one embodiment, there is a conflat gate valve 1078, between the second chamber 1022 and the third chamber 1042, operative to seal off the second chamber 1022 from the third chamber 1042 during the lithium deposition step of the third chamber 1042. That is because lithium is highly reactive and can travel long distances (e.g., migrate from the third chamber 1042 to the second chamber 1022 or even the first chamber 1002). Accordingly, to prevent such contaminant migration, in one embodiment, the gate valve 1078 is closed at least during the lithium deposition step discussed in the context of FIG. 5. For example, the second arm 1060 may be in control of the subject device while the conflat gate valve 1078 is closed and the subject device is in the third chamber 1042.

As discussed above, different chambers are used for different processing steps, wherein the subject battery device being manufactured is always in a controlled environment (i.e., steady state deposition conditions are maintained). Different chambers are subject to different sputtering guns and deposition tools, represented herein by the first and second magnetrons 1006 and 1028, vapor source for polymer coating 1044 and the Knudsen cell 1050 for Li deposition. In conventional device fabrication systems, due to the nature of sputtering, each chamber may have contaminants on different portions of the walls. Thus, each chamber may have coatings of different materials, that, over time, may affect the creation of the battery device being fabricated. By virtue of using different dedicated chambers while maintaining the environment of the device being manufactured, as discussed herein, such cross-contamination is controlled and substantially reduced.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A solid state electrochemical battery fabrication device, comprising:
a first chamber comprising a first magnetron;
a second chamber comprising a second magnetron, coupled to the first chamber;
a third chamber comprising a vapor source for a polymer deposition, coupled to the second chamber;
a Knudsen cell coupled to the third chamber and configured to deposit lithium on a battery being fabricated;
a hollow shaft configured to connect the first, second, and third chambers, and provide a hermetic seal between the first, second, and third chambers; and
a first telescopic arm having a housing coupled to a first end of the hollow shaft and configured to extend out of its housing from the first chamber to the second chamber, wherein:
the first magnetron is a direct current (DC) sputtering gun,
the first chamber further comprises a first collimator coupled between the first magnetron and the battery being fabricated, and
the first collimator together with the first telescopic arm, are configured to provide a two-dimensional control of a deposition angle of particles of the first magnetron.

2. The solid state electrochemical battery fabrication device of claim 1, wherein the first chamber further comprises a pump configured to evacuate at least the first chamber and the second chamber via the hollow shaft.

3. The solid state electrochemical battery fabrication device of claim 1, further comprising a pump coupled to the Knudsen cell and configured to evacuate the third chamber of at least lithium (Li) particles.

4. The solid state electrochemical battery fabrication device of claim 1, further comprising a conflat gate valve coupled between the third chamber and the Knudsen cell.

5. The solid state electrochemical battery fabrication device of claim 1, further comprising a conflat gate valve coupled between the second chamber and the third chamber.

6. The solid state electrochemical battery fabrication device of claim 1, wherein the vapor source for the polymer deposition is configured to deposit at least one layer of passivation over a second polar conductor layer of the battery being fabricated.

7. The solid state electrochemical battery fabrication device of claim 1, further comprising a heat element positioned in the hollow shaft between the first chamber and the second chamber and configured to control a temperature in the first, second, and third chambers.

8. The solid state electrochemical battery fabrication device of claim 1, wherein the heat element is a heat lamp configured to align molecules that are deposited to a microstructure orientation of 101.

9. The solid state electrochemical battery fabrication device of claim 1, wherein the first magnetron is configured to provide $LiCoO_2$ particles during a first polar conductor deposition step.

10. A solid state electrochemical battery fabrication device, comprising:
a first chamber comprising a first magnetron;
a second chamber comprising a second magnetron, coupled to the first chamber;
a third chamber comprising a vapor source for a polymer deposition, coupled to the second chamber;
a Knudsen cell coupled to the third chamber and configured to deposit lithium on a battery being fabricated;
a hollow shaft configured to connect the first, second, and third chambers, and provide a hermetic seal between the first, second, and third chambers; and
a first telescopic arm having a housing coupled to a first end of the hollow shaft and configured to extend out of its housing from the first chamber to the second chamber, wherein:
the second magnetron is a radio frequency (RF) sputtering gun,
the second chamber further comprises a second collimator coupled between the magnetron and the battery, and
the second collimator together with the first telescopic arm, are configured to provide a two-dimensional control of a deposition angle of particles of the second magnetron.

11. The solid state electrochemical battery fabrication device of claim 10, wherein the second magnetron is a radio frequency (RF) sputtering gun configured to provide $Li_3PO_4$ particles during an electrolyte deposition step.

12. The solid state electrochemical battery fabrication device of claim 1, wherein the second chamber further comprises a gauge configured to track a lithium phosphorous oxynitride (LiPON) deposition thickness on the battery being fabricated.

13. The solid state electrochemical battery fabrication device of claim 1, wherein the first telescopic arm is further configured to extend into the third chamber.

14. The solid state electrochemical battery fabrication device of claim 1, further comprising a second telescopic arm having a housing coupled to a second end of the hollow shaft and configured to extend out of its housing from the third chamber to the second chamber to receive the battery being fabricated from the first arm and carry the battery being fabricated to the third chamber.

15. The solid state electrochemical battery fabrication device of claim 1, wherein the first telescopic arm is further configured to rotate on its axis to provide one dimensional control of a deposition angle onto the battery being fabricated.

\* \* \* \* \*